United States Patent
Kulkarni et al.

(10) Patent No.: US 6,283,357 B1
(45) Date of Patent: Sep. 4, 2001

(54) FABRICATION OF CLAD HOLLOW CATHODE MAGNETRON SPUTTER TARGETS

(75) Inventors: Shailesh Kulkarni, Milford; Raymond K. F. Lam, Park Ridge, both of NJ (US); Tony Sica, Mt. Vernon, NY (US)

(73) Assignee: Praxair S.T. Technology, Inc., Danbury, CT (US)

( * ) Notice: Subject to any disclaimer, the term of this patent is extended or adjusted under 35 U.S.C. 154(b) by 0 days.

(21) Appl. No.: 09/368,062

(22) Filed: Aug. 3, 1999

(51) Int. Cl.[7] ............ B21D 39/00; C23C 14/02
(52) U.S. Cl. .......... 228/155; 228/136; 204/192.02; 204/298.12
(58) Field of Search .............. 228/155, 141.1, 228/135, 136; 204/192.02, 298.12

(56) References Cited

U.S. PATENT DOCUMENTS

| | | | |
|---|---|---|---|
| 3,912,152 | * 10/1975 | Forand, Jr. | 228/190 |
| 4,202,709 | * 5/1980 | Shibamori et al. | 148/11.5 |
| 4,869,468 | * 9/1989 | Johnson | 266/44 |
| 4,873,419 | * 10/1989 | Acheson | 219/125.1 |
| 5,143,590 | * 9/1992 | Strothers et al. | 204/298.12 |
| 5,687,600 | * 11/1997 | Emigh et al. | |
| 5,729,084 | 3/1998 | Hale et al. | 313/446 |
| 5,858,556 | * 1/1999 | Eckert et al. | 428/586 |
| 5,982,973 | * 11/1999 | Yan et al. | 385/141 |
| 6,030,514 | * 2/2000 | Dunlop et al. | 204/298.12 |

FOREIGN PATENT DOCUMENTS

| | | |
|---|---|---|
| 04263066 | 9/1992 | (JP) . |
| 6-158297 | * 6/1994 | (JP) . |
| 0032347 | 6/2000 | (WO) . |

* cited by examiner

Primary Examiner—Patrick Ryan
Assistant Examiner—Jonathan Johnson
(74) Attorney, Agent, or Firm—Blake T. Biederman

(57) ABSTRACT

A method is provided for forming clad hollow cathode magnetron sputter targets that are lighter in weight and/or less expensive than monolithic targets. A plate of sputter target material is bonded to a sheet of cladding material that is lighter in weight and/or less expensive than the sputter target material. This clad target assembly is then formed into a hollow cathode magnetron sputter target, such as by deep drawing. The clad hollow cathode magnetron further provides greater percent utilization of sputter target material than monolithic targets.

10 Claims, 1 Drawing Sheet

FABRICATION OF CLAD HOLLOW CATHODE MAGNETRON SPUTTER TARGETS

FIELD OF THE INVENTION

This invention relates to a method of fabricating hollow cathode magnetron sputter targets for use in the physical vapor deposition of thin films on semiconductor devices.

BACKGROUND OF THE INVENTION

In the semiconductor industry, there is a constant need for faster and smaller integrated circuit chips to manage an ever-growing assortment of sophisticated applications. Thus, the semiconductor industry is edging toward mass production of circuit devices with sub-0.25 $\mu$m features. To produce these devices, significant changes in all aspects of manufacturing are needed, including new materials and manufacturing technologies. The sub-0.25 $\mu$m features, along with their increased aspect ratios, compared to current devices, present a significant challenge to current physical vapor deposition (PVD) and metallization technologies.

A new development in physical vapor deposition (PVD) technology that addresses the challenges of the sub-0.25 $\mu$m devices is the hollow cathode magnetron (HCM), which is a high density plasma device for use as an ionized PVD sputter target source for semiconductor device fabrication. This HCM sputtering source in an ionized PVD application is a low-cost, high-performance alternative to traditional PVD technologies.

HCM technology, when used in an ionized PVD environment, facilitates more efficient production of ions of target material that are directed at right angles to a substrate being coated for efficient via filling. This technology provides a highly directional deposition that is relatively unaffected by feature width. It offers excellent bottom coverage of high-aspect-ratio features without the use of a collimator. The HCM sputter target, as currently designed, has a cup shape. HCMs are an attractive alternative to planar cathodes because the cup design enables superior filling of high aspect ratio features. A special arrangement of oriented permanent magnets is mounted on the exterior wall of the target, which creates a high-density plasma inside the target region. This HCM design allows deposited neutrals (i.e., neutral polarity atoms) to be recycled until they are ionized by the high-density plasma. A longer target lifetime results from this recycling effect. Other HCM advantages include longer shield life, extended maintenance intervals and significantly lower cost of ownership than other sputtering technologies. This deposition technology meets and exceeds the demands of the semiconductor industry for sub-0.25 $\mu$m devices. Specifically, HCM ionized source technology enables high quality Ta, TaN, Cu, Ti, TiN, and other films to be deposited into sub-0.25 $\mu$m dual damascene structures.

HCM targets have generally been fabricated as monolithic targets by casting a billet of target material and then forming the billet into the specially designed HCM target by known metal forming techniques, such as forging or deep drawing. The formed target is then machined to final dimensions. The target materials are generally quite expensive and heavy. As target dimensions continue to increase to meet industry demands, the monolithic targets are becoming more expensive, heavier and more difficult to handle.

Furthermore, erosion of particles from the sputter target surface generally occurs in a relatively narrow ring-shaped region, called the "racetrack region." Only the portion of the total target material in the racetrack region is consumed before the target must be replaced. For monolithic HCM sputter targets, typically only 25% or less of usable target material falls within the racetrack region and is therefore actually sputtered. The large amount of remaining expensive, usable target material is either wasted or must be recycled.

There is thus a need to develop a method for fabricating inexpensive, lightweight HCM targets to accommodate the continuing need for increased target dimensions, and further to develop such a target having a higher percentage utilization of sputter target material.

SUMMARY OF THE INVENTION

The present invention provides a clad HCM sputter target having a sheet of lightweight and/or inexpensive, low purity cladding material bonded to a plate of sputter target material, the sputter target material preferably having a fine, uniform microstructure. This clad HCM sputter target is lighter in weight and/or less expensive than monolithic HCM sputter targets and provides a greater percentage utilization of sputter target material. To this end, and in accordance with the principles of the present invention, a sputter target material is formed into a plate, such as by pressing and/or rolling, and preferably heat treated to develop a fine, uniform microstructure. This plate of target material is then bonded to a sheet of lightweight and/or inexpensive cladding material, such as by diffusion bonding, explosion bonding, friction welding, epoxy bonding, soldering or brazing, to form a clad target assembly having a lighter weight and/or costing less than monolithic sputter targets of equal dimensions. Preferably, the bonding method is one in which the microstructure of the target material is not substantially altered, such as explosion bonding.

The clad target assembly is then formed into a HCM sputter target, such as by deep drawing, forging, hydroforming, explosive forming, punching, roll forming, stretch forming or electromagnetic forming. The HCM sputter target is preferably formed by deep drawing, whereby the microstructure of the target material is not significantly altered. The total amount of sputter target material used to form the clad HCM sputter target of the present invention is less than with monolithic assemblies, yet the same amount of sputter target material is available in the racetrack region for sputtering.

A flange of relatively inexpensive, commercial grade material may then be attached to the HCM sputter target, such as by mechanical joints, E-beam welding, brazing or epoxy bonding.

There is thus provided a HCM sputter target assembly capable of meeting increased target dimension requirements without becoming prohibitively expensive or heavy. There is further provided a HCM sputter target with increased percentage utilization of sputter target material.

These and other objects and advantages of the present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

A clad HCM sputter target assembly, preferably having fine, uniform grains, is fabricated by a process including bonding a plate of sputter target material to a lightweight and/or inexpensive cladding material and forming the clad assembly into a HCM assembly. Where a fine, uniform microstructure is obtained in the sputter target material prior to bonding to the cladding material, the steps of bonding the sputter target material to the cladding material and forming the clad assembly into a HCM sputter target assembly preferably are accomplished by methods which do not substantially alter the microstructure of the sputter target material. Where a fine, uniform microstructure does not yet exist before bonding, the bonding process itself may be used to alter the microstructure, or alternatively, the formed HCM sputter target assembly may be recrystallization annealed to obtain the desired microstructure.

To this end, and in accordance with the principles of the present invention, a sputter target material is first fabricated into a plate, such as by pressing and/or rolling or by any other appropriate, well-known metalworking operation, with or without intermediate annealing. Depending on the particular target material used, pressing and rolling may be performed either at room temperature or elevated temperature. Typical dimensions for the fabricated plate for 200 mm diameter semiconductor wafer applications are 25 inch by 25 inch by 0.3 inch. Larger dimensions are expected for 300 mm diameter semiconductor wafer applications.

The sputter target material is a metal, metal oxide, metal silicide or alloy which is to be deposited onto a semiconductor wafer, and is advantageously a highly pure material, preferably having a purity of 99% to 99.99999%. These materials include, for example, pure metals, alloys, suicides and oxides of tantalum, titanium, tungsten, copper, nickel, chromium, aluminum, cobalt, molybdenum, silver, gold, platinum, ruthenium, rhodium, palladium, iron, bismuth, germanium, niobium and vanadium. Preferred suicides include those of tantalum, titanium, tungsten, nickel, chromium, cobalt, molybdenum and platinum. For example, a plate may be formed out of tantalum, titanium, tungsten, copper or aluminum for deposition of thin films of Ta, TaN, Ti, TiN, W, AlCu and Cu. These sputter targets may be used for such applications as deposition of Ti/TiN liner/barrier layers for tungsten plug and aluminum fill as well as advanced TaN/Cu barrier/seed processes for copper interconnects.

Figure 1:
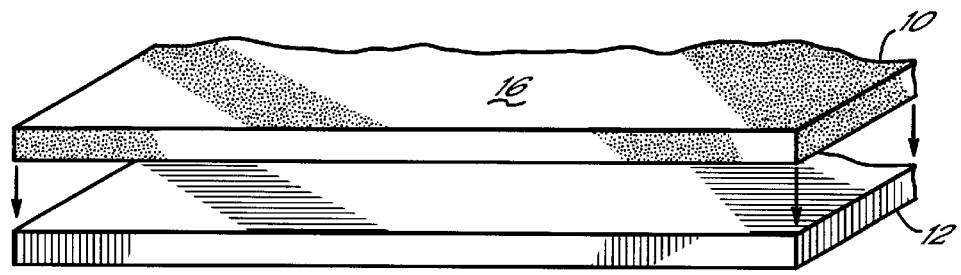
FIG. 1 is a perspective view depicting the bonding step of the present invention.
Figure 2:
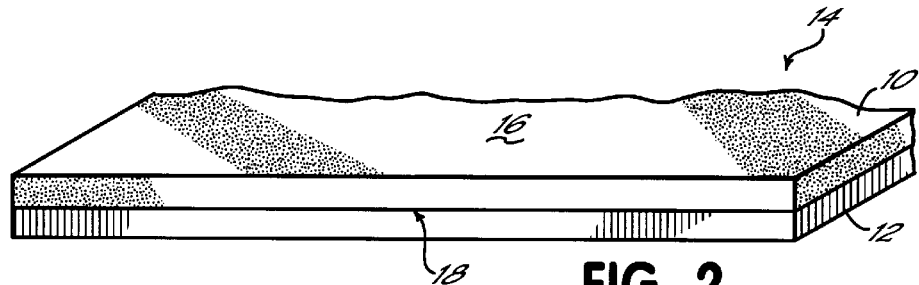
FIG. 2 is a perspective view of a clad target assembly of the present invention.

Referring to FIGS. 1 and 2, the plate 10 of sputter target material is bonded to a sheet 12 of cladding material to form a clad target assembly 14. The cladding material is preferably a lightweight material, such as copper, aluminum or titanium, and/or is a less expensive material than that used for the sputter target material, such as commercial grades, which are substantially lower purity materials. The cladding material is preferably a good thermal conductor such that heat generated at the target sputter surface 16 is quickly dissipated. It is also preferred that the cladding material be ductile and malleable to enable the bonded materials to be formed into the cup-shaped structure typical of HCM sputter targets. For optimum results, the sheet 12 of cladding material should be of similar dimension to the plate 10 of sputter target material.

Any number of known bonding techniques may be used to bond the plate 10 of sputter target material to the sheet 12 of cladding material. These techniques include diffusion bonding, explosion bonding, friction welding, epoxy bonding, soldering and brazing.

In one embodiment of the present invention, the plate of sputter target material is heat treated prior to bonding to develop a fine, uniform microstructure. It is well known that fine, uniform grains increase target performance and improve thin film uniformity. In this embodiment, it is preferable that the bonding step not significantly alter this microstructure. In explosion bonding, the heat generated from detonation of the explosives is generated for an insufficient time for heat transfer throughout the sputter target material, and thus there is no appreciable temperature increase in the target material to produce grain growth. Thus, the explosion bonding technique is capable of bonding the sputter target plate 10 to the cladding sheet 12 without any significant alteration of the microstructure of the sputter target material formed by prior heat treating. In friction welding, the plate 10 of sputter target material is pressed against the cladding sheet 12 and rotated at high pressure to create heat and friction at the interface 18 to melt the materials together. Although there is some change of the microstructure in the area of the interface 18 of the clad target assembly 14, the change in microstructure does not generally permeate throughout the thickness of the sputter target material. Thus, where a fine, uniform grain structure is achieved in the sputter target material prior to bonding, explosion bonding and friction welding are preferred methods for bonding the plate 10 of target material to the cladding sheet 12.

In another embodiment of the present invention, the plate of sputter target material is not heat treated prior to bonding to the cladding material. Rather, the fine, uniform microstructure is obtained via the bonding process. In diffusion bonding, for example, high temperatures are used, which alter the microstructure of the materials being bonded. The temperature and duration of the bonding process may thus be designed so as to alter the sputter target material to achieve fine, uniform grains while simultaneously bonding the target material to the cladding material.

Figure 3:
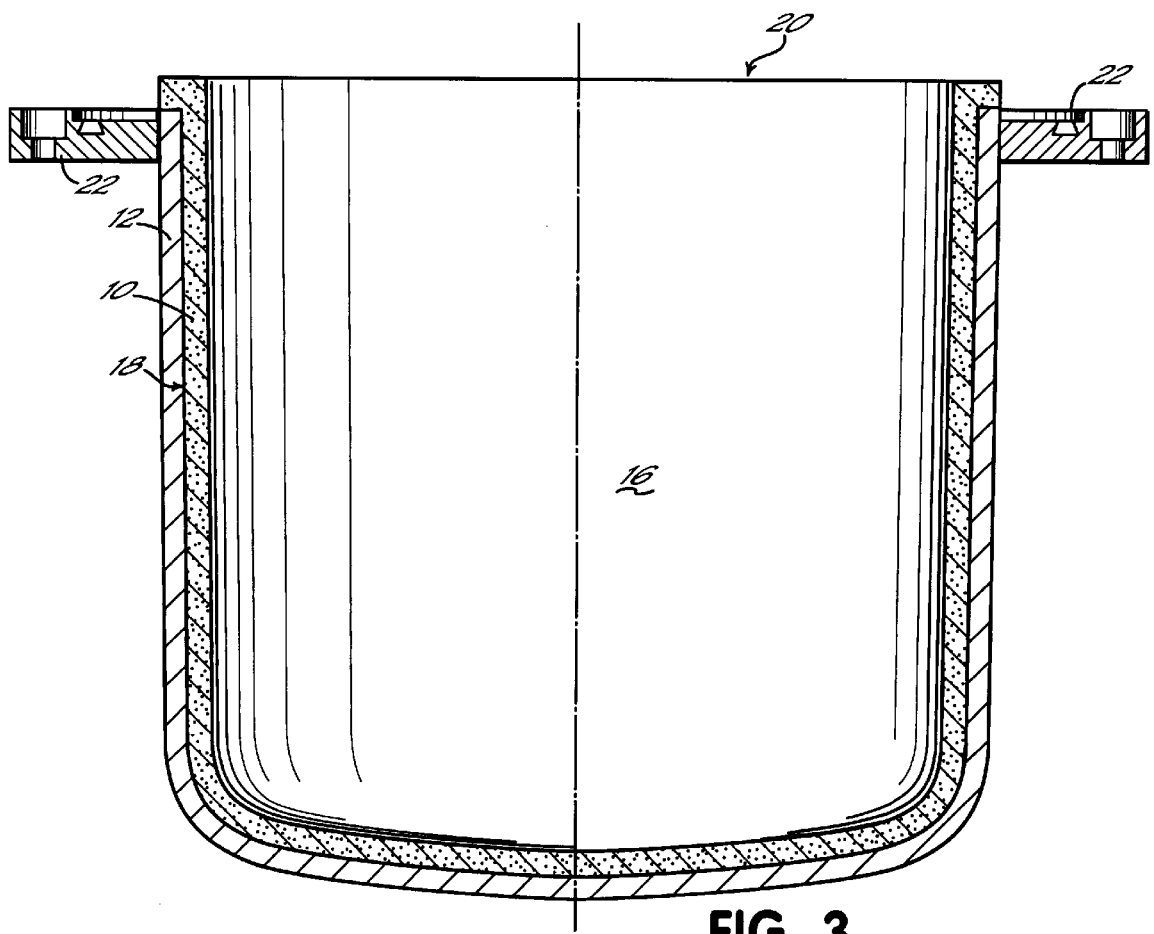
FIG. 3 is a cross-sectional view of a clad hollow cathode magnetron sputter target of the present invention.

Referring to FIG. 3, this clad target assembly 14 is then formed into a near net-shaped HCM sputter target 20 by a suitable metalworking operation. By near net-shaped is meant that the sputter target 20 is close to the final shape with only minimal final machining necessary to achieve the desired final dimensions. Suitable metalworking operations include deep drawing, forging, hydroforming, explosive forming, punching, roll forming, stretch forming and electromagnetic forming. Where a fine, uniform microstructure has been obtained in the sputter target material either by heat treating the plate of sputter target material prior to bonding or by the bonding process itself, deep drawing is a preferred forming method because no significant alteration of the microstructure of the sputter target material occurs by this method. The deep drawing operation may be carried out at room temperature to further ensure that the microstructure is not altered, or it may be carried out at elevated temperatures if the type of material requires it.

Again referring to FIG. 3, HCM targets 20 are typically provided with a flange 22 for attaching the sputter target 20 to sputtering machines (not shown). The flange 22 of known or future-developed configuration may be attached to the near net-shaped HCM sputter target 20 by any permissible means, including E-beam welding, brazing, epoxy bonding or mechanical fastening. The flange 22 may be permanently or releasably attached to the HCM sputter target 20. The flange 22 is preferably constructed using a commercial grade material having sufficient structural integrity for fastening into the sputtering machine, such as commercial grades of copper and titanium.

The HCM sputter target 20 of the present invention can then be machined to final dimensions for use in physical vapor deposition of thin films onto semiconductor wafers.

In yet another embodiment of the present invention, where a fine, uniform microstructure has not been obtained in the sputter target material either by heat treating prior to bonding or by the bonding process, the HCM sputter target may be subjected to a recrystallization annealing to refine the microstructure. This may occur prior to attaching the flange, prior to final machining or after final machining. According to the principles of any of the embodiments described herein, the clad HCM sputter target of the present invention may be fabricated such the microstructure of the sputter target material comprises fine, uniform grains.

The overall dimensions of the clad HCM sputter target of the present invention remain the same as prior monolithic assemblies, but the percent utilization of sputter target material increases for the present invention. By way of example only, and not intended to represent commercially accurate values, a monolithic assembly of desired dimensions may contain 20 lbs. of sputter target material, with only 5 lbs. of sputter target material available in the racetrack region for sputtering. Thus, the percent utilization of sputter target material is only 25%. With a clad target assembly of the present invention having the same desired dimensions, only 10 lbs. of sputter target material is used for the plate, which is bonded to a 7-lb. sheet of cladding material, with the same 5 lbs. of sputter target material available in the racetrack region for sputtering. Thus, the percent utilization of sputter target material is increased to 50% by the present invention.

There is thus provided by the principles of the present invention a HCM sputter target comprising a material for sputtering bonded to a lightweight and/or inexpensive sheet of cladding material, the overall assembly being capable of meeting large target dimension requirements at less cost and lower weights than monolithic target assemblies, while providing increased percent utilization of target material.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. For example, the principles of the present invention may be used for sputter targets of any desired material, not just those specifically listed herein. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method of fabricating sputter targets comprising the steps of:
    bonding a plate of sputter target material to a sheet of cladding material to form a clad target assembly; and
    deep drawing the clad target assembly into a clad hollow cathode magnetron sputter target, the clad sputter target having an inside formed with the sputter target material and an outside formed with the cladding material for increasing the percent utilization of the target material contained in the clad sputter target as available in the clad sputter target for sputtering.

2. The method of claim 1 including the additional step of attaching a flange to the clad sputter target for attaching the clad sputter target to sputtering machines.

3. The method of claim 1 wherein the deep drawing forms the clad sputter target having above a twenty five percent utilization of the target material contained in the clad sputter target as available in the clad sputter target for sputtering.

4. The method of claim 1 wherein the bonding is explosive bonding.

5. The method of claim 1 wherein the bonding is diffusion bonding.

6. A method of fabricating sputter targets comprising the steps of:
    bonding a plate of sputter target material to a sheet of cladding material to form a clad target assembly, the sputter target material having a microstructure; and
    deep drawing the clad target assembly into a clad hollow cathode magnetron sputter target, the clad sputter target having an inside formed with the sputter target material and an outside formed with the cladding material for increasing the percent utilization of the target material contained in the clad sputter target as available in the clad sputter target for sputtering, and the microstructure of the clad sputter target material remaining substantially unchanged.

7. The method of claim 6 including the additional step of attaching a flange to the clad sputter target for attaching the clad sputter target to sputtering machines.

8. The method of claim 6 wherein the deep drawing forms the clad sputter target having above a twenty five percent utilization of the target material contained in the clad sputter target as available in the clad sputter target for sputtering.

9. The method of claim 6 wherein the bonding is explosive bonding.

10. The method of claim 6 wherein the bonding is diffusion bonding.

* * * * *